July 26, 1966 W. W. STALEY 3,263,023

PRINTED CIRCUITS ON HONEYCOMB SUPPORT WITH
PIERCEABLE INSULATION THEREBETWEEN
Original Filed April 18, 1958

WITNESSES
John E. Heasley, Jr.
Leon M. Garman

INVENTOR
William W. Staley
BY
Benjamin D. Witt
ATTORNEY

1

3,263,023

PRINTED CIRCUITS ON HONEYCOMB SUPPORT WITH PIERCEABLE INSULATION THEREBETWEEN

William W. Staley, Pasadena, Md., assignor to Westinghouse Electric Corporation, Pittsburgh, Pa., a corporation of Pennsylvania Continuation of application Ser. No. 729,428, Apr. 18, 1958. This application Apr. 9, 1964, Ser. No. 360,165
3 Claims. (Cl. 174—68.5)

Figure 2:
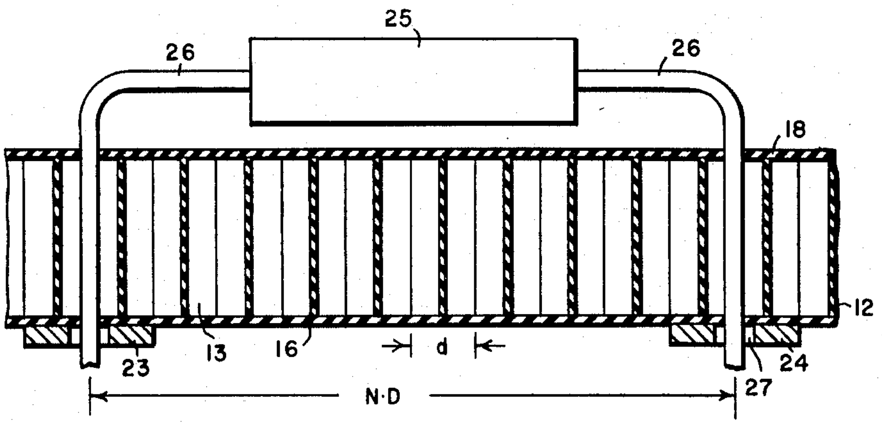

This application is a continuation of application Serial No. 729,428, filed April 18, 1958, now abandoned, and assigned to the same assignee.

The present invention relates to electric circuit construction and, more particularly, to an improvement in so-called printed circuits and methods of manufacturing the same.

Circuits of this general nature are described in National Bureau of Standards Circular No. 468, entitled, "Printed Circuit Techniques," issued November 15, 1947, by United States Department of Commerce. Such circuits and arrangements for utilizing them in electrical apparatus are also described in a "Special Report" issued by Electronics Magazine in September 1955, and entitled, "Mechanized Production of Electronic Equipment."

The term printed circuit as used in the aforementioned articles, and herein, is intended to mean electrical conductor strips or filaments that have been printed or plated or otherwise intimately secured on an insulating panel prior to the attachment of electrical circuit components thereto. With the advent and increased use of such printed circuits for electrical and electronic equipment it has become increasingly necessary to devise printed circuit structures and methods of attaching electrical components to such structures which structures and methods are easily performed by high-speed automatic apparatus and which result in the production of the circuits at minimum cost. The methods of processing printed circuit structures in the prior art have generally been complex and expensive in that it has generally been necessary to utilize one or more steps for punching or drilling the printed circuit panel to provide openings for insertion of the wire leads of the circuit components to be attached.

In the prior art processes one method has been to form the printed circuit upon an insulating base of phenol-formaldehyde resin or the like. Such material possesses certain desirable characteristics such as relatively high tensile strength, excellent insulating qualities, good resistance to temperature and low moisture absorption. Such materials are relatively brittle and, accordingly, it is difficult to form holes or apertures therethrough by conventional means such as punching or drilling. In addition, the high brittleness of the usual prior art materials results in a high proportion of rejection of circuit panels during the manufacture of electrical apparatus and further results in a relatively high proportion of breakage of the printed circuit panels due to vibration during shipment. Certain prior art processes utilizing panel members of phenolic composition have required heating of the panel in order to render it sufficiently pliable to permit holes to be punched therein. The expansion of such material upon the application of heat thereto is somewhat unpredictable, and it has been found that the apertures formed therein often times are located in improper positions such that they do not accurately register with the circuit conductors provided on the surface of the panel. Such misaligned circuit panels, of course, must be rejected with a resultant increase in production cost. Thus, it is clearly desirable to provide a process and structure for printed circuits which eliminates the necessity of

2 forming accurately positioned holes or apertures in the circuit panel.

Accordingly, it is an object of the present invention to provide an improved circuit panel which is light in weight and more rugged in structure than those heretofore known.

It is another object of the present invention to provide an improved electrical circuit panel to which electronic components can be readily and positively connected and which requires a minimum of preparatory processing in order to accommodate the circuit component leads.

It is a further object of the present invention to provide an improved printed circuit structure which is readily adaptable to automatic component assembly techniques and which permits substantial tolerances in the positioning of circuit components.

It is another object of the present invention to provide an improved method of constructing printed circuits which obviates the necessity of preforming apertures in the circuit panel for the passage of component conductors therethrough.

It is another object of the present invention to provide an improved printed circuit structure which is adapted for automatic assembly of electrical components therewith and is self-sufficient to mechanically retain the components in predetermined positions until they are soldered into the printed circuit.

Figure 1:
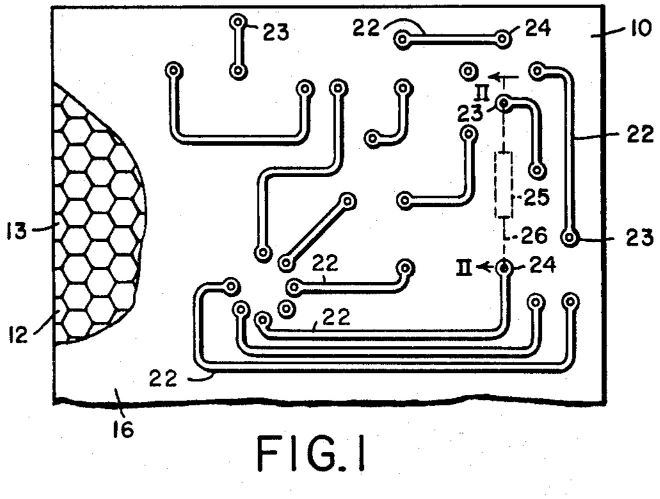

The foregoing and other objects of this invention will be apparent from the following description taken in accordance with the accompanying drawing throughout which like reference characters represent like parts, which drawing forms a part of this application and in which:

FIGURE 1 is a plan view of a printed circuit panel partially cut away to show the structure of the panel base member in accordance with the invention; and FIG. 2 is a greatly enlarged sectional view taken substantially along the lines II—II of FIG. 1 and illustrating a circuit component applied to the circuit panel.

Now referring to FIG. 1 of the drawings, there is shown a circuit panel 10 which comprises a base member 12 of cellular construction. The base member preferably has a thickness which is large relative to the cross sectional dimensions of the individual cells or cavities forming the cellular structure. The cellular cavities or apertures in the base member may be formed by any one of various methods and may be prismatic, cylindrical or other desired shape. In one preferred form, for example, the base member is of a hoyencomb structure as indicated at 13 in FIG. 1. In such honeycomb-like structure the individual cells of the base member have a longitudinal dimension which is transverse to the plane of the circuit panel and the individual cavities may extend from one side of the base member to the other so as to form substantially perpendicular apertures extending through the base member. It is to be understood, of course, that the panel need not necessarily be of honeycomb construction or of any other particular polygonal cell configuration, but may be various other cellular structures, such as foamed thermosetting resin, or the like.

The surfaces of the base member at which the cavities open, preferably are closed so as to seal the exposed cavities. Closure of the cavities at the surface is accomplished in the preferred embodiment by a thin sheet 16 of phenolic paper or the like. The thin sheet 16 provides a continuous surface upon which a plurality of circuit conductors 22 having terminal portions 23 and 24 may be formed.

In a preferred method of constructing the printed circuit, the circuit conductors 22 are created on the thin phenolic sheet 16 prior to bonding of the sheet 16 to the base member 12. The sheet 16 is thereafter laminated to the foraminous base member by means of a thermosetting resin or by means of an adhesive such as, for example, cement No. M620 manufactured by Rubber and Asbestos Corporation.

The circuit conductors 22 may be formed by any one of a large variety of known printing or plating processes. In this regard the printed conductors 22 may be formed by bonding a metallic foil to the entire surface of the phenolic layer 16 followed by the steps of outlining the desired circuit pattern on the foil-clad panel with an insoluble acid-resistant ink or paint by means of silk screening, off-set printing or other suitable pattern transfer process. The metallic foil may then be treated with an acid solution which etches away exposed portions of the metallic foil thereby leaving remaining portions in the form of the desired conductor pattern.

Another exemplary technique for forming the printed conductor pattern is as follows: a continuous sheet of copper foil is permanently bonded to the plastic or phenolic layer 16. The copper foil is then coated with a light-sensitive emulsion. A photographic negative having opaque portions representing a circuit pattern is placed over the light-sensitive emulsion and is subjected to light from an arc lamp or other ultraviolet source. The light passes through the translucent portions of the negative and causes hardening of exposed portions of the emulsion. The photographic negative is then removed and the soft portions of the emulsion are washed from the surface of the copper foil leaving only hardened emulsion in the form of the desired circuit pattern. The surface of the copper foil is then covered with an etching solution such as ferric chloride which dissolves and removes the unprotected copper, leaving only the copper portions which are protected by the hardened emulsion. Finally, the hardened emulsion is removed by any convenient method leaving the copper thereunder exposed in the form of an electric circuit pattern on the insulating sheet 16. Since the latter method of producing the circuit does not constitute the essence of the present invention, it need not be described further beyond noting that there have been several similar processes heretofore proposed for providing a plurality of printed electrical conductors on the surface of a sheet-like dielectric member such as the phenolic sheet 16.

In FIG. 1 a selected pair of the electrical conductors 22 is shown as having a circuit component 25 extending between the terminal portions 23 and 24 of the respective conductors. The circuit component 25 may, for example, be a resistor or capacitor or the like having axial leads extending therefrom, the leads 26 being bent to extend perpendicularly from the axis of the component and through the base member 12 and the insulating layer 16. As best shown in FIG. 2 the body portion 25 of the circuit component is positioned closely adjacent the back surface of the circuit panel and the wire leads 26 extend through a back surface insulating layer 18, through a pair of spaced apertures 13 in the base member 12, and through the front insulating layer 16 to make electrical contact with the terminal portions 23 and 24 of the circuit conductors 22. The terminal portion 23 discloses one embodiment in which the terminal comprises a relatively thin metallic layer which may be punctured by the wire lead 26 upon insertion of the lead through the circuit panel in registry with the terminal portion 23. The terminal portion 24, as shown in FIG. 2, represents a second embodiment in which the terminal portion has a substantially annular shape providing a central opening 27 through which the wire lead 26 may extend when the wire lead is forcibly inserted through the circuit panel so as to puncture the insulating layer 16.

By provision of the circuit panel structure as just described, it is possible to completely eliminate the necessity of drilling or punching holes in the panel base member for insertion of the wire leads 26 therethrough. Since the base member 12 is cellular or foraminous in structure, it provides a rugged structural member of light weight which is more than adequate to support the mass of the circuit components mounted thereon. The cellular structure further provides greater flexure strength than would a solid, non-foraminous sheet of similar raw material. Since it has a greater flexure strength than a dense plate formed of similar raw material it has a greater resistance to vibration and other effects which would tend to crack a brittle sheet member.

As best shown in FIG. 2, the base member in the preferred embodiment comprises a regular and repeating pattern of individual polygonal cells 13 which cells extend transversely through the base member and are closed at each end by the insulating layers 16 and 18. In this form of the invention the individual apertures 13 have substantially equal cross sectional dimensions and are substantially equidistantly spaced so as to have predetermined distances between centers of the apertures. In preparing the circuit conductor pattern to be utilized, the fact that all the apertures 13 have a predetermined center-to-center distance *d* is observed. The center-to-center distance between terminal portions 23 and 24 is caused to be an exact integral multiple *"nd"* of the inter-apertures distance *d*. By thus correlating the relative dimensions of the base member apertures 13 and the inter-terminal dimensions, the wire leads 26 may be assembled on the circuit panel by first aligning the wire leads for transverse projection through the annular conductive portions 24 of the printed conductors and then forcibly inserting the wire leads 26 into the surface insulating layer 18. The wire leads 26 will puncture the layer 18 and the layer 16 and pass through the central opening 27 of the terminals 24 without encountering any resistance whatsoever from the structural material of the base member 12.

The circuit panel structure heretofore described constitutes a printed circuit which may be used in conjunction with automatic insertion machines such as those described in the aforementioned Electronics "Special Report" without the necessity of prepunching or predrilling the circuit panel in order to provide openings for insertion of component leads therethrough.

In the preferred embodiment the front surface insulating layer 16 and the back surface layer 18 each preferably comprise a sheet of phenolic paper such as "Micarta" about .003 to .006 inch thick. It is to be understood, however that the layers 16 and 18 may have a greater thickness and could be as thick as .010 to .015 inch in some practical embodiments. The essential criteria in this regard is that the sheets 16 and 18 must be thin enough so that component leads may be automatically pierced therethrough without substantial deformation of the leads.

Although the present invention has been described in conjunction with panels having conductive patterns disposed thereon of a type normally utilized in electronic circuits, such as employed in television receivers and the like, it should be understood that the term "printed circuit" as used in this application includes circuits for use in many different types of apparatus. It will be readily apparent that the structure described is not restricted to low current systems such as those encountered in electronic apparatus, but is also applicable to high current apparatus with the difference being merely a question of the necessary cross sectional area of the circuit conductors 22. Likewise, it is to be understood that the invention is not restricted to the honeycomb-like cellular structure described in the preferred embodiment, but encompasses various other cellular or foraminous structural members having a plurality of closely spaced cavities extending at least partially through the base member.

While the present invention has been shown and described in conjunction with certain preferred embodiments only, it will be apparent to those skilled in the art that it is not so limited, but it is susceptible of various changes and modifications without departing from the principles of the invention or from the spirit and scope thereof.

I claim as my invention:

1. A printed circuit assembly comprising, a honeycombed planar support member having a plurality of preformed transverse apertures extending therethrough, an insulating member bonded to at least one side of said support member, said insulating member comprising an unpierced layer after being bonded and being of such a thickness to permit leads readily to pierce therethrough, a plurality of electrically distinct circuit conductors intimately secured to the outside surface of said insulating member, and circuit components having leads forming holes in the previously unpierced layer by piercing through said insulating member and passing through preformed apertures in said support member and secured in electrical contact with preselected of said circuit conductors.

2. A printed circuit assembly comprising, a honeycombed planar support member having a plurality of preformed transverse apertures extending therethrough, a first insulating member disposed on one side of said support member, a second insulating member disposed on another side of said support member, said first and second insulating members each comprising an unpierced layer after being bonded and being thin enough to permit leads readily to pierce therethrough, a plurality of electrically distinct circuit conductors intimately secured to the outside surface of one of said insulating members, and circuit components having leads forming holes in the previously unpierced layers by piercing through said first and second insulating members and passing through preformed apertures in said support members and secured in electrical contact with preselected of said circuit conductors.

3. A printed circuit assembly comprising, a honeycombed planar support member having a plurality of preformed transverse apertures extending therethrough, a first insulating member bonded to one side of said support member, a second insulating member bonded to the opposite side of said support member, said first and second insulating members each comprising an unpierced layer after being bonded and being of such a thickness to permit leads readily to pierce therethrough, a plurality of electrically distinct circuit conductors intimately secured to the outside surface of said first insulating member, and circuit components having leads forming holes in the previously unpierced layers by piercing through said first and second insulating members and passing through preformed apertures in said support member and secured in electrical contact with preselected of said circuit conductors.

References Cited by the Examiner

UNITED STATES PATENTS

| | | | |
|---|---|---|---|
| 2,441,960 | 5/1948 | Eisler | 317—101 |
| 3,052,749 | 9/1962 | Snapp et al. | 174—68.5 |

FOREIGN PATENTS

| | | |
|---|---|---|
| 753,875 | 8/1956 | Great Britain. |

LARAMIE E. ASKIN, *Primary Examiner.*

DARRELL L. CLAY, ROBERT K. SCHAEFER, *Examiners.*